United States Patent
Ulbricht et al.

(10) Patent No.: US 10,233,275 B2
(45) Date of Patent: Mar. 19, 2019

(54) CO-CROSSLINKER SYSTEMS FOR ENCAPSULATION FILMS COMPRISING BIS(ALKENYLAMIDE) COMPOUNDS

(71) Applicants: Daniel Ulbricht, Darmstadt (DE); Marcel Hein, Niedernberg (DE); Frank Kleff, Bruchkoebel-Oberissigheim (DE); Stephanie Schauhoff, Langen (DE); Juergen Ohlemacher, Bad Vilbel (DE)

(72) Inventors: Daniel Ulbricht, Darmstadt (DE); Marcel Hein, Niedernberg (DE); Frank Kleff, Bruchkoebel-Oberissigheim (DE); Stephanie Schauhoff, Langen (DE); Juergen Ohlemacher, Bad Vilbel (DE)

(73) Assignee: Evonik Degussa GmbH, Essen (DE)

(*) Notice: Subject to any disclaimer, the term of this patent is extended or adjusted under 35 U.S.C. 154(b) by 594 days.

(21) Appl. No.: 14/974,733

(22) Filed: Dec. 18, 2015

(65) Prior Publication Data
US 2016/0177007 A1    Jun. 23, 2016

(30) Foreign Application Priority Data
Dec. 19, 2014 (EP) ................................. 14199279

(51) Int. Cl.
| C08F 226/06 | (2006.01) |
| C09D 131/04 | (2006.01) |
| C08F 255/02 | (2006.01) |
| H01L 31/048 | (2014.01) |

(52) U.S. Cl.
CPC ........ *C08F 226/06* (2013.01); *C08F 255/026* (2013.01); *C09D 131/04* (2013.01); *H01L 31/0481* (2013.01); *Y02E 10/50* (2013.01)

(58) Field of Classification Search
CPC ....... C08F 136/20; C08F 136/02; C08F 36/02
See application file for complete search history.

(56) References Cited

U.S. PATENT DOCUMENTS

| 792,783 | A | 6/1905 | Muthmann |
| 2,537,816 | A | 1/1951 | Dudley |
| 2,894,950 | A | 7/1959 | Lloyd et al. |
| 3,053,796 | A | 9/1962 | D'Aleuo |
| 3,065,231 | A | 11/1962 | Frazier, Jr. et al. |
| 3,108,967 | A | 10/1963 | Galli et al. |
| 3,165,515 | A | 1/1965 | D'Alelio |
| 3,244,709 | A | 4/1966 | D'Alelio |
| 3,322,761 | A | 5/1967 | Little et al. |
| 3,651,173 | A | 3/1972 | Doi et al. |
| 3,655,519 | A | 4/1972 | Scherhag et al. |
| 3,700,667 | A | 10/1972 | Kitano et al. |
| 3,714,099 | A | 1/1973 | Biale |
| 4,196,289 | A | 4/1980 | Saito et al. |
| 4,319,062 | A | 3/1982 | Boozalis et al. |
| 4,451,651 | A | 5/1984 | Brand |
| 4,519,930 | A | 5/1985 | Kakiuchi |
| 4,684,689 | A | 8/1987 | Yannich et al. |
| 4,767,642 | A | 8/1988 | Shimizu et al. |
| 4,857,610 | A | 8/1989 | Chmelir et al. |
| 4,893,999 | A | 1/1990 | Chmelir et al. |
| 4,908,395 | A | 3/1990 | Kurita et al. |
| 5,266,627 | A | 11/1993 | Meverden et al. |
| 5,367,025 | A | 11/1994 | Needham |
| 5,372,887 | A | 12/1994 | Segawa et al. |
| 5,556,635 | A | 9/1996 | Istin et al. |
| 5,723,703 | A | 3/1998 | De Jong et al. |
| 5,959,008 | A | 9/1999 | Birbaum et al. |
| 9,169,340 | B2 | 10/2015 | Patel et al. |
| 2001/0037022 | A1 | 11/2001 | Gupta et al. |
| 2001/0045229 | A1* | 11/2001 | Komori ................... B32B 15/08 136/251 |
| 2002/0018883 | A1 | 2/2002 | Okazaki et al. |
| 2003/0111159 | A1 | 6/2003 | Hashimoto et al. |
| 2006/0008665 | A1 | 1/2006 | Kotsubo et al. |
| 2007/0208142 | A1 | 9/2007 | Adair et al. |
| 2007/0259998 | A1 | 12/2007 | Okada et al. |
| 2008/0176994 | A1 | 7/2008 | Allermann et al. |
| 2008/0274245 | A1 | 11/2008 | Lee et al. |
| 2010/0229946 | A1 | 9/2010 | Kataoka |
| 2011/0027601 | A1 | 2/2011 | Ruffner, Jr. |

(Continued)

FOREIGN PATENT DOCUMENTS

| CA | 893127 A | 2/1972 |
| CN | 1753966 A | 3/2006 |

(Continued)

OTHER PUBLICATIONS

Steven K. Hirring et al. "Fundamentals of Curing Elastomers with Peroxides and Coagents I. Coagent Structure—Property Relationships", Cray Valley USA, LLC, XF55405563, 2005, pp. 1-18.
Extended Search Report dated Jun. 19, 2015 in European Patent Application No. 14199279.2 (with English translation of category of cited documents).
Shengkun Wu, "Study on Synthesis of Cross-linking Agent TAC", Anhui Chemical Industry, vol. 35, No. 2, pp. 30-32, Apr. 2009, with English translation.

(Continued)

*Primary Examiner* — Christopher M Rodd

(74) *Attorney, Agent, or Firm* — Oblon, McClelland, Maier & Neustadt, L.L.P.

(57) ABSTRACT

A first composition (A) contains (i) at least one compound (I) selected from the group consisting of triallyl isocyanurate, and triallyl cyanurate, wherein the compound (I) is preferably triallyl isocyanurate, and (ii) at least one bis (alkenylamide) compound. A second composition (B) contains the first composition (A) and at least one polyolefin copolymer. The composition (B) is used for the production of a film for encapsulation of an electronic device, especially a solar cell.

18 Claims, No Drawings

(56) References Cited

U.S. PATENT DOCUMENTS

| | | |
|---|---|---|
| 2011/0160383 A1 | 6/2011 | Kwon et al. |
| 2011/0263748 A1 | 10/2011 | Schauhoff et al. |
| 2012/0024376 A1 | 2/2012 | Fukudome et al. |
| 2012/0077911 A1 | 3/2012 | Haraguchi et al. |
| 2012/0095223 A1 | 4/2012 | Yamaura |
| 2012/0095224 A1 | 4/2012 | Yamaura |
| 2012/0095225 A1 | 4/2012 | Yamaura |
| 2012/0132360 A1 | 5/2012 | Damm |
| 2012/0202070 A1 | 8/2012 | Asanuma et al. |
| 2012/0285529 A1 | 11/2012 | Kataoka et al. |
| 2012/0292487 A1 | 11/2012 | Yukawa et al. |
| 2012/0295199 A1 | 11/2012 | Takeyama et al. |
| 2013/0112270 A1 | 5/2013 | Patel et al. |
| 2014/0296400 A1 | 10/2014 | Ikeda et al. |
| 2014/0311571 A1 | 10/2014 | Kataoka |
| 2014/0378618 A1 | 12/2014 | Brandau et al. |
| 2015/0353784 A1 | 12/2015 | Yamaura et al. |
| 2016/0068662 A1 | 3/2016 | Yamaura et al. |
| 2016/0177007 A1 | 6/2016 | Ulbricht et al. |
| 2016/0177013 A1 | 6/2016 | Ulbricht et al. |
| 2016/0177014 A1 | 6/2016 | Ulbricht et al. |
| 2016/0177015 A1 | 6/2016 | Ulbricht et al. |
| 2016/0177124 A1 | 6/2016 | Ulbricht et al. |

FOREIGN PATENT DOCUMENTS

| | | |
|---|---|---|
| CN | 102304246 A | 1/2012 |
| CN | 102372813 A | 3/2012 |
| CN | 102391568 A | 3/2012 |
| CN | 102863918 A | 1/2013 |
| CN | 102911612 A | 2/2013 |
| CN | 103045105 A | 4/2013 |
| CN | 103525321 A | 1/2014 |
| CN | 102504715 B | 2/2014 |
| CN | 103755876 A | 4/2014 |
| CN | 103804774 A | 5/2014 |
| CN | 103881596 A | 6/2014 |
| CN | 103923374 A | 7/2014 |
| CN | 103980591 A | 8/2014 |
| CN | 104081539 | 10/2014 |
| CN | 104099005 | 10/2014 |
| CN | 104099005 A | 10/2014 |
| CN | 104109280 | 10/2014 |
| CN | 104505143 A | 4/2015 |
| DE | 37 04 067 A1 | 8/1987 |
| DE | 102 41 914 A1 | 3/2004 |
| EP | 0 227 470 A2 | 7/1987 |
| EP | 0 228 638 A1 | 7/1987 |
| EP | 0 358 007 A2 | 3/1990 |
| EP | 0 406 664 A1 | 1/1991 |
| EP | 1 164 167 A1 | 12/2001 |
| EP | 1 506 978 A1 | 2/2005 |
| EP | 2 355 163 A1 | 8/2011 |
| EP | 2 436 701 A1 | 4/2012 |
| EP | 2 457 728 A1 | 5/2012 |
| EP | 2 530 098 A1 | 12/2012 |
| EP | 2 562 821 A1 | 2/2013 |
| EP | 2 581 409 A1 | 4/2013 |
| EP | 3 034 525 A1 | 6/2016 |
| EP | 3 034 526 A1 | 6/2016 |
| EP | 3 034 530 A1 | 6/2016 |
| JP | 47-48568 B4 | 11/1972 |
| JP | 48-38633 A | 4/1974 |
| JP | 51-139854 A | 12/1976 |
| JP | 60-197674 A | 10/1985 |
| JP | 62-45579 A | 2/1987 |
| JP | 3-64389 A | 3/1991 |
| JP | 4-174887 A | 8/1992 |
| JP | 7-218146 A | 8/1995 |
| JP | 9-118860 A | 5/1997 |
| JP | 10-168419 A | 6/1998 |
| JP | 11-20094 A | 1/1999 |
| JP | 11-20095 A | 1/1999 |
| JP | 11-20096 A | 1/1999 |
| JP | 11-20097 A | 1/1999 |
| JP | 11-20098 A | 1/1999 |
| JP | 11-21541 A | 1/1999 |
| JP | 11-255753 A | 9/1999 |
| JP | 2000-26527 A | 1/2000 |
| JP | 2001-135657 A | 5/2001 |
| JP | 2001-206921 A | 7/2001 |
| JP | 2002-190610 A | 7/2002 |
| JP | 2005-112925 A | 4/2005 |
| JP | 2006-12784 A | 1/2006 |
| JP | 2006-36876 A | 2/2006 |
| JP | 2007-123488 A | 5/2007 |
| JP | 2007-281135 A | 10/2007 |
| JP | 2007-299917 A | 11/2007 |
| JP | 2007-305634 A | 11/2007 |
| JP | 2008-50467 A | 3/2008 |
| JP | 2008-98457 A | 4/2008 |
| JP | 2008-205448 A | 9/2008 |
| JP | 2008-260894 A | 10/2008 |
| JP | 2009-135200 A | 6/2009 |
| JP | 2011-111515 A | 6/2011 |
| JP | 2011-173937 A | 9/2011 |
| JP | 2012-41466 A | 3/2012 |
| JP | 2012-67174 A | 4/2012 |
| JP | 2012-74616 A | 4/2012 |
| JP | 2012-87260 A | 5/2012 |
| JP | 2013-138094 A | 7/2013 |
| KR | 10-2004-0090340 | 7/2014 |
| KR | 10-2015-0059957 | 6/2015 |
| TW | 201441288 | 11/2014 |
| WO | WO 95/02834 A1 | 1/1995 |
| WO | WO 98/33237 A1 | 10/1998 |
| WO | WO 99/37730 A1 | 7/1999 |
| WO | WO 02/42342 A2 | 5/2002 |
| WO | WO 03/037968 A1 | 5/2003 |
| WO | WO 2004/048463 A1 | 6/2004 |
| WO | WO 2005/100018 A1 | 10/2005 |
| WO | WO 2008/006661 A2 | 1/2008 |
| WO | WO 2008/009540 A1 | 1/2008 |
| WO | WO 2008/036708 A2 | 3/2008 |
| WO | WO 2008/053810 A1 | 8/2008 |
| WO | WO 2014/129573 A1 | 8/2014 |
| WO | WO 2014/189019 A1 | 11/2014 |
| WO | WO 2015/149632 A1 | 10/2015 |

OTHER PUBLICATIONS

James R. Dudley, et al. "Cyanuric Chloride Derivatives. III. Alkoxy-s-Triazines" Contribution from the Stamford Research Laboratories of the American Cyanamid Company, Journal of the American Chemical Society, vol. 73, Jul. 1951, pp. 2986-2990.

Chinese Office Action in Application No. 201510954443.9, dated Sep. 3, 2018 of CN105713146 (English Translation).

* cited by examiner

CO-CROSSLINKER SYSTEMS FOR ENCAPSULATION FILMS COMPRISING BIS(ALKENYLAMIDE) COMPOUNDS

BACKGROUND OF THE INVENTION

Field of the Invention

The present invention relates to a first composition (A) comprising (i) at least one compound (I) selected from the group consisting of triallyl isocyanurate, triallyl cyanurate, wherein the compound (I) is preferably triallyl isocyanurate, and (ii) at least one bis(alkenylamide) compound. In addition, the present invention also relates to a second composition (B) comprising the first composition (A) and at least one polyolefin copolymer. Finally, the present invention relates to the use of the composition (B) for production of a film for encapsulation of an electronic device, especially a solar cell.

Discussion of the Background

Photovoltaic modules (photovoltaic="PV") typically consist of a layer of symmetrically arranged silicon cells welded into two layers of a protective film. This protective film is itself stabilized in turn by a "backsheet" on its reverse side and a "frontsheet" on its front side. The backsheet and frontsheet may either be suitable polymer films or consist of glass. The function of the encapsulation material is essentially to protect the PV module from weathering effects and mechanical stress, and for that reason the mechanical stability of the particular encapsulation material is an important property. In addition, good encapsulation materials have a rapid curing rate, high gel content, high transmission, low tendency to temperature- and heat-induced discolouration and high adhesion (i.e. a low tendency to UV-induced delamination).

The encapsulation materials described for this purpose in the related art (for example WO 2008/036708 A2) are typically based on materials such as silicone resins, polyvinyl butyral resins, ionomers, polyolefin films or ethylene-vinyl acetate copolymers ("EVA").

Processes for producing such encapsulation films are familiar to those skilled in the art (EP 1 164 167 A1). In these processes the crosslinkers, together with a polyolefin copolymer (and possibly further additives), are homogeneously mixed in an extruder for example, and then extruded to give a film. The process described in EP 1 164 167 A1 relates to encapsulation films based on EVA but is also applicable to films made of other materials, for example those mentioned hereinabove.

The encapsulation of the silicon cells is typically performed in a vacuum lamination oven (EP 2 457 728 A1). To this end, the layer structure of the PV module is prepared and initially heated up gradually in a lamination oven (consisting of two chambers separated by a membrane). This softens the polyolefin copolymer (for example EVA). At the same time, the oven is evacuated in order to remove the air between the layers. This step is the most critical and takes between 4 and 6 minutes. Subsequently, the vacuum is broken via the second chamber, and the layers of the module are welded to one another by application of pressure. Heating is simultaneously continued up to the crosslinking temperature, the crosslinking of the film then taking place in this final step.

The use of EVA in particular is standard in the production of encapsulation films for solar modules. However, EVA also has a lower specific electrical resistance $\rho$ than polyolefin films for example. This makes the use of EVA films as encapsulation material less attractive, since it is specifically encapsulation materials having high specific electrical resistance $\rho$ that are desired.

This is because what is called the "PID" effect (PID=potential-induced degradation) is currently a major quality problem for PV modules. The term "PID" is understood to mean a voltage-induced performance degradation caused by what are called "leakage currents" within the PV module.

The damaging leakage currents are caused not only by the structure of the solar cell but also by the voltage level of the individual PV modules with respect to the earth potential—in most unearthed PV systems, the PV modules are subjected to a positive or negative voltage. PID usually occurs at a negative voltage relative to earth potential and is accelerated by high system voltages, high temperatures and high air humidity. As a result, sodium ions migrate out of the cover glass of the PV module to the interface of the solar cell and cause damage ("shunts") there, which can lead to performance losses or even to the total loss of the PV module.

The risk of occurrence of a PID effect can be distinctly reduced by increasing the specific electrical resistance $\rho$ of the encapsulation films.

The specific electrical resistance $\rho$ or else volume resistivity (also abbreviated hereinafter to "VR") is a temperature-dependent material constant. It is utilized to calculate the electrical resistivity of a homogeneous electrical conductor. Specific electrical resistance is determined in accordance with the invention by means of ASTM-D257.

The higher the specific electrical resistance $\rho$ of a material, the less photovoltaic modules are prone to the PID effect. A significant positive effect in increasing the specific electrical resistance $\rho$ of encapsulation films is therefore the increase in the lifetime and efficiency of PV modules.

The related art discusses the problem of the PID effect in connection with encapsulation films for PV modules in CN 103525321 A. This document describes an EVA-based film for encapsulating solar cells, which comprises triallyl isocyanurate ("TAIC") and trimethylolpropane trimethacrylate ("TMPTMA") as co-crosslinkers and, as further additives, preferably comprises a polyolefin ionomer and a polysiloxane for hydrophobization. This film exhibits a reduced PID effect. However this film has the disadvantage that polyolefin ionomers are relatively costly. Moreover, polysiloxanes have an adverse effect on adhesion properties. In addition, the examples do not give any specific information as to what improvements are achievable with what concentrations.

A crosslinker combination of TAIC and TMPTMA is also described by JP 2007-281135 A. The TMPTMA here brings about acceleration of the crosslinking reaction and hence leads to elevated productivity.

JP 2012-067174 A and JP 2012-087260 A describe an encapsulation film for solar cells based on EVA/a polyolefin which comprises not only TAIC but also, for example, ethylene glycol dimethacrylate, neopentyl glycol dimethacrylate, hexane-1,6-diol dimethacrylate as crosslinkers. These co-crosslinkers initially retard the crosslinking reaction and thus increase the processing time window.

JP 2009-135200 A likewise describes crosslinkers comprising TAIC and various (meth)acrylate derivatives of polyfunctional alcohols, and what is described in this case is improved heat resistance combined with a lower tendency to delamination of the EVA-based encapsulation.

JP 2007-281135 A and JP 2007-305634 A describe crosslinker combinations of TAIC and trimethylolpropane triacrylate ("TMPTA") for use in the production of multilayer co-extruded EVA encapsulation films for solar cells.

Similar combinations of crosslinkers for solar cell encapsulation films are described, for example, by JP 2013-138094 A, JPH11-20094, JPH11-20095, JPH11-20096, JPH11-20097, JPH11-20098, JPH11-21541, CN 102391568 A, CN 102504715 A, CN 102863918 A, CN 102911612 A, CN 103045105 A, CN 103755876 A, CN 103804774 A, US 2011/0160383 A1, WO 2014/129573 A1.

There is accordingly a need for novel co-crosslinker systems, especially for production of encapsulation films for solar cells, which result in a markedly increased electrical resistance compared to films crosslinked in accordance with the prior art, in order thus to lead to a reduction in the PID risk when used in photovoltaic modules.

SUMMARY OF THE INVENTION

The problem addressed by the present invention was therefore that of providing novel compositions which can be used for production of films having maximum specific electrical resistance ρ and which are therefore particularly suitable for encapsulation of electronic devices, for example solar cells. These compositions should additionally be usable in the established processes and should not substantially increase the costs of the films. In particular, said compositions should not exhibit the disadvantages observed for the co-crosslinker systems of the related art and in particular here for the compositions cited in CN 103525321 A.

It has now been found that, surprisingly, it is possible with the aid of particular compositions to obtain an encapsulation film for solar cells that meets these requirements. The compositions found here considerably increase volume resistivity, even when comparatively small amounts are employed, without adversely affecting other film properties. The films exhibit excellent processibility, high transparency and excellent UV and heat ageing properties.

The present invention relates to a composition (A), comprising:

(i) at least one compound (I) selected from the group consisting of triallyl isocyanurate, and triallyl cyanurate; and (ii) at least one compound (II) defined by the structural formula:

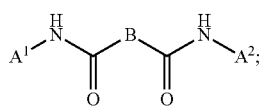
(II)

wherein $A^1$, $A^2$ are each independently selected from the group consisting of the following a) and b)

(a) an unbranched or branched alkenyl group which has 3 to 18 carbon atoms and at least one terminal double bond, and (b) a group of the chemical structure (III) with

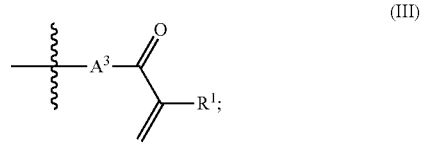
(III)

wherein $R^1$=hydrogen or methyl;

$A^3$ is an unbranched or branched alkylene group having 1 to 12 carbon atoms;

B is selected from the group consisting of —$NR^2$—, the chemical structure —$(CH_2)_p$—$NR^3$—$(CH_2)_q$— and the chemical structure (IV) with

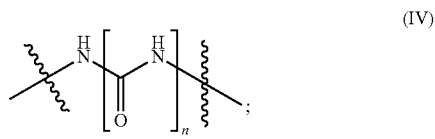
(IV)

wherein $R^2$, $R^3$ are each independently selected from the group consisting of i) hydrogen, ii) an alkyl group having 1 to 20 carbon atoms, iii) an unbranched or branched alkenyl group which has 3 to 18 carbon atoms and at least one terminal double bond, a group of the chemical structure (V) with

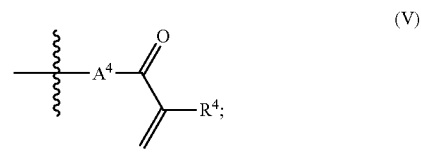
(V)

wherein $R^4$=hydrogen or methyl;

$A^4$ is an unbranched or branched alkylene group having 1 to 12 carbon atoms;

and wherein n, p, q are each independently an integer in the range of 1 to 5;

and wherein at least one compound (II) is present in a proportion of at least 1% by weight based on a total weight of all the compounds (I) in the composition (A).

The present invention also relates to a composition (B), comprising:

at least one polyolefin copolymer; and a composition (A) as above.

The present invention further relates to a film for encapsulation of an electronic device, comprising: the above composition (B) in crosslinked form.

Moreover, the present invention relates to a method for encapsulating an electronic device, comprising:

contacting said electronic device with the above composition (B) and crosslinking said composition (B).

DETAILED DESCRIPTION OF THE INVENTION

Any ranges mentioned herein below include all values and subvalues between the lowest and highest limit of this range.

The co-crosslinker systems according to the present invention can surprisingly be used for producing films for encapsulating electronic devices, for example solar cells, having a high specific resistance.

Accordingly, the co-crosslinker system according to the invention is a composition (A) comprising (i) at least one compound (I) selected from the group consisting of triallyl isocyanurate, triallyl cyanurate, wherein the compound (I) is more preferably triallyl isocyanurate; and (ii) at least one compound (II), the compound (III) being defined in general terms by the structural formula:

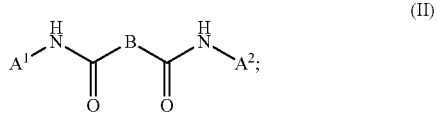

wherein
$A^1$, $A^2$ are each independently selected from the group consisting of
unbranched or branched alkenyl group which has 3 to 18 carbon atoms and at least one terminal double bond,
a group of the chemical structure (III) with

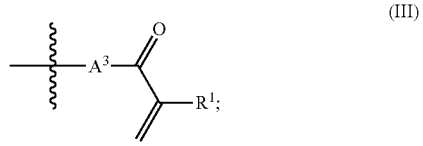

wherein
$R^1$=hydrogen or methyl;
$A^3$ is an unbranched or branched alkylene group having 1 to 12 carbon atoms;
B is selected from the group consisting of —$NR^2$—, the chemical structure —$(CH_2)_p$—$NR^3$—$(CH_2)_q$— and the chemical structure (IV) with

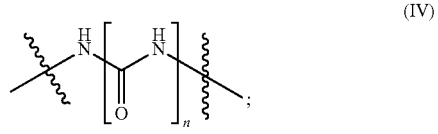

where $R^2$, $R^3$ are each independently selected from the group consisting of hydrogen, alkyl group having 1 to 20 carbon atoms, unbranched or branched alkenyl group which has 3 to 18 carbon atoms and at least one terminal double bond, a group of the chemical structure (V) with

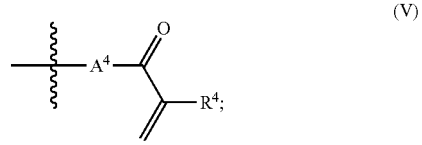

where
$R^4$=hydrogen or methyl;
$A^4$ is an unbranched or branched alkylene group having 1 to 12 carbon atoms; and where n, p, q are each independently an integer in the range of 1 to 5;

and where at least one compound (II) encompassed by the composition (A) is present in a proportion of at least 1% by weight based on the total weight of all the compounds (I) encompassed by the composition (A).

In a preferred embodiment, at least one compound (II) encompassed by the composition (A) is present in a proportion of at least 1% by weight to 50% by weight, preferably 1.7% by weight to 25% by weight, more preferably 2.1% by weight to 11.1% by weight, even more preferably 2.2% by weight to 6.4% by weight, even more preferably still 3.1% by weight to 6.4% by weight, most preferably 4.4% by weight to 5.3% by weight, based on the total weight of all the compounds (I) encompassed by the composition (A).

In a preferred embodiment, in the composition (A),
$A^1$, $A^2$ are each independently selected from the group consisting of allyl group, methallyl group, a group of the chemical structure (III) with

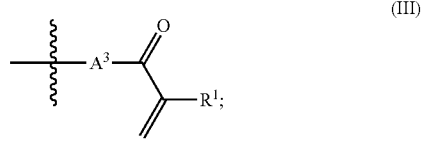

where
$R^1$=hydrogen or methyl;
$A^3$ is an unbranched or branched alkylene group having 1 to 6 carbon atoms;
B is selected from the group consisting of —$NR^2$—, —$CH_2$—$NH$—$CH_2$—, and the chemical structure (IV) with

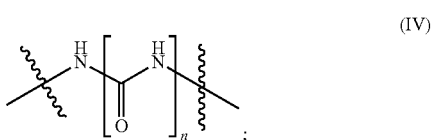

where $R^2$ is selected from the group consisting of hydrogen, alkyl group having 1 to 20 carbon atoms, allyl group, methallyl group,
a group of the chemical structure (V) with

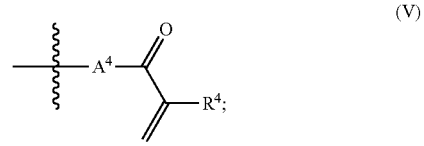

where
$R^4$=hydrogen or methyl;
$A^4$ is an unbranched or branched alkylene group having 1 to 6 carbon atoms; and where n is an integer in the range of 1 to 3.

Most preferably, in the composition (A), the compound (II) is selected from the group consisting of the chemical structures (VI), (VII), (VIII), (IX), (X) with

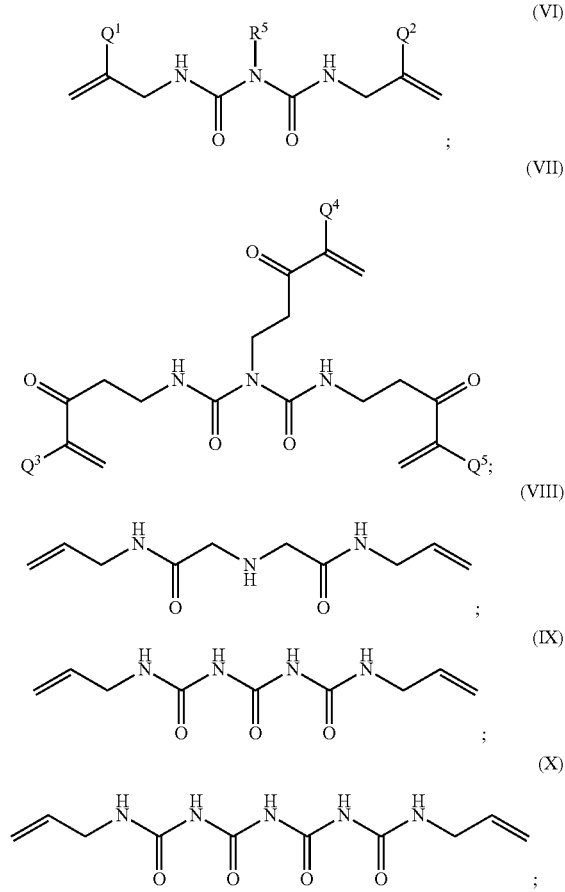

where R⁵ is selected from the group consisting of hydrogen, alkyl group having 1 to 20 carbon atoms, allyl group, methallyl group;

and where $Q^1$, $Q^2$, $Q^3$, $Q^4$, $Q^5$ are each independently hydrogen or methyl.

Most preferably, in the composition (A), the compound (II) is selected from triallyl biuret, n-propyl diallyl biuret, iminodi(N-allylacetamide).

A compound of the chemical structure (II) is also referred to in the context of the invention as "bis(alkenylamide) compound".

The expression "at least one compound (II) encompassed by the composition (A) is present in a proportion of at least 1% by weight based on the total weight of all the compounds (I) encompassed by the composition (A)" means that at least one compound conforming to the general structural formula (II) is present in the composition (A) in an amount of at least 1% by weight based on the total weight of all the compounds (I) encompassed by composition (A).

This means that, for example, in the embodiment of the invention in which the composition (A) comprises triallyl isocyanurate as compound (I) and triallyl biuret as compound (II), the triallyl biuret is present in a proportion of at least 1% by weight based on the weight of the triallyl isocyanurate. In an even more preferred embodiment, the proportion of triallyl biuret based on the weight of the triallyl isocyanurate is then 2.1% to 25.0% by weight, more preferably 3.1% to 11.1% by weight, most preferably 5.3% to 6.4% by weight. Triallyl biuret is a compound of formula (VI) in which $Q^1=Q^2=H$ and $R^5=$allyl.

This also means, for example, that in the embodiment of the invention in which the composition (A) comprises triallyl isocyanurate as compound (I) and n-propyl diallyl biuret as compound (II), the n-propyl diallyl biuret is present in a proportion of at least 1.0% by weight based on the weight of the triallyl isocyanurate. In an even more preferred embodiment, the proportion of n-propyl diallyl biuret based on the weight of the triallyl isocyanurate is then 1.1% to 5% by weight, more preferably 1.5% to 3.0% by weight, most preferably 1.7% by weight. n-Propyl diallyl biuret is a compound of formula (VI) in which $Q^1=Q^2=H$ and $R^5=$n-propyl.

This also means, for example, that in the embodiment of the invention in which the composition (A) comprises triallyl isocyanurate as compound (I) and iminodi(N-allylacetamide) as compound (II), the iminodi(N-allylacetamide) is present in a proportion of at least 1.0% by weight based on the weight of the triallyl isocyanurate. In an even more preferred embodiment, the proportion of iminodi(N-allylacetamide) based on the weight of the triallyl isocyanurate is then 1.1% to 10.0% by weight, more preferably 2.2%-8% by weight, most preferably 4.4% by weight. Iminodi(N-allylacetamide) is the compound of the formula (VIII).

This also means that, for example, in the embodiment of the invention in which the composition (A) comprises triallyl cyanurate as compound (I) and triallyl biuret as compound (II), the triallyl biuret is present in a proportion of at least 1.0% by weight based on the weight of the triallyl cyanurate. In an even more preferred embodiment, the proportion of triallyl biuret based on the weight of the triallyl cyanurate is then 2.1% to 25% by weight, more preferably 3.1% to 11.1% by weight, most preferably 5.3% to 6.4% by weight.

The groups "allyl group" and "methylallyl group" have the following respective chemical structures:

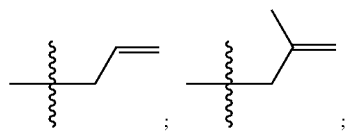

Allyl group    methallyl group

In the context of the invention an "unbranched or branched alkenyl group having at least one terminal double bond" is a monovalent unbranched or branched hydrocarbon group having at least one terminal double bond.

Preferably, an "unbranched or branched alkyl group which has 3 to 18 carbon atoms and at least one terminal double bond" in the context of the invention has a chemical structure

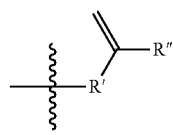

where R' is an unbranched or branched alkylene group having x carbon atoms and R" is independently hydrogen or an unbranched or branched alkyl group having y carbon atoms, where x and y are integers;

and where x when R"=H is in the range of 1 to 16 (when x=1, R' is methylene); and where x in the case that R"=unbranched or branched alkyl group is in the range of 1 to 15 and y in that case is in the range of 1 to (16−x), where the sum total of x+y in that case must not exceed the value of 16.

More particularly, in that case, R"=H or methyl and R' is an unbranched or branched alkylene group having 1 to 15 carbon atoms. Preferably, R"=H or methyl and R' is an unbranched alkylene group having 1 to 10 carbon atoms. More preferably, R'=methylene and R"=H or methyl.

An "alkylene group" in the context of the invention is a divalent saturated hydrocarbyl radical.

An unbranched or branched alkylene group having 1 to 6 carbon atoms is especially selected from methylene, ethylene, n-propylene, n-butylene, n-pentylene, n-hexylene. "n-Hexylene" is equivalent to "hexamethylene".

In order to assure the homogeneity of the film and the efficacy of the film, it is essential that at least one compound (II) encompassed by the composition (A) is present in a proportion of at least 1% by weight based on the total weight of all the compounds (I) encompassed by the composition (A). This ensures that the specific resistance of the films obtainable thereby attains the particular values needed for industrial scale applications and a sufficient improvement is achieved over the related art crosslinker systems. Compositions in which no single compound (II) is present in such a sufficient amount do not contribute to a sufficient degree to an increase in specific resistance.

With regard to the proportion of all the compounds of the chemical structure (II) in the composition (A), this proportion is restricted only by the above-described specification with regard to the proportion of at least one compound (II) encompassed by the composition (A). Preferably, the total weight of all the compounds of the chemical structure (II) encompassed by the composition (A) in the composition (A), based on the total weight of all the compounds (I) encompassed by the composition (A), is at least 1% by weight, especially in the range from 1.1% by weight to 50% by weight, preferably 2% by weight to 20.0% by weight, more preferably 3% by weight to 10.0% by weight.

The present co-crosslinker systems are preferably used for production of films for encapsulation of electronic devices, for example solar cells in PV modules.

These co-crosslinker systems are typically used together with polyolefin copolymers.

The present invention accordingly also relates to a composition (B) comprising at least one polyolefin copolymer and the composition (A) according to the invention.

Polyolefin copolymers usable in accordance with the invention are known to those skilled in the art and are described, for instance, in WO 2008/036708 A2 and JP 2012-087260.

More particularly, in accordance with the invention, polyolefin copolymers used are ethylene/α-olefin interpolymers, the term "interpolymer" meaning that the polyolefin copolymer in question has been prepared from at least two different monomers. Thus, the term "interpolymer" especially includes polyolefin copolymers formed from exactly two monomer units, but also terpolymers (for example ethylene/propylene/1-octene, ethylene/propylene/butene, ethylene/butene/1-octene, ethylene/butene/styrene) and tetrapolymers.

Useful polyolefin copolymers in accordance with the invention are especially ethylene/α-olefin copolymers which preferably do not have any further monomer units aside from ethylene and the α-olefin, the "α-olefin" in the context of the invention preferably being selected from the group consisting of propene, 1-butene, 4-methyl-1-pentene, 1-hexene, 1-octene, 1-decene, 1-dodecene, 1-tetradecene, 1-hexadecene, 1-octadecene, 3-cyclohexyl-1-propene, vinylcyclohexane, acrylic acid, methacrylic acid, norbornene, styrene, methylstyrene, vinyl acetate.

Even more preferably, the polyolefin copolymer according to the invention in the composition (B) is an ethylene-vinyl acetate copolymer.

If polyolefin copolymers used are ethylene/α-olefin interpolymers, these especially have an α-olefin content in the range of 15% to 50% by weight, based on the total weight of the ethylene/α-olefin interpolymer. Preferably, the α-olefin content is in the range of 20% to 45% by weight, more preferably in the range of 25% to 40% by weight, even more preferably 26% to 34% by weight, most preferably 28% to 33% by weight, based in each case on the total weight of the ethylene/α-olefin interpolymer.

In the preferred embodiment in which the polyolefin copolymer is an ethylene-vinyl acetate copolymer, the ethylene-vinyl acetate copolymer especially has a vinyl acetate content in the range of 15% to 50% by weight, based on the total weight of the ethylene-vinyl acetate copolymer. Preferably, the vinyl acetate content in that case is in the range of 20% to 45% by weight, more preferably in the range of 25% to 40% by weight, even more preferably 26% to 34% by weight, most preferably 28% to 33% by weight, based in each case on the total weight of the ethylene/vinyl acetate copolymer.

The α-olefin content, especially the content of vinyl acetate in the case of the ethylene/vinyl acetate copolymer, is determined here by the method described in ASTM D 5594:1998 [*"Determination of the Vinyl Acetate Content of Ethylene-Vinyl Acetate (EVA) Copolymers by Fourier Transform Infrared Spectroscopy"*].

There is no particular restriction here in the proportion of the composition (A) encompassed by the composition (B). The proportion of the composition (A) in the composition (B) is especially in the range from 0.05% to 10% by weight, preferably in the range from 0.1% to 5% by weight, more preferably in the range from 0.2% to 3% by weight, even more preferably 0.3% to 1.5% by weight, especially preferably 0.5% by weight, based in each case on the mass of all the polyolefin copolymers encompassed by the composition (B).

According to the invention, the composition (B) is suitable for production of an encapsulation film for electronic devices, for example solar cells. For this purpose, it is subjected to a crosslinking reaction in the course of solar module lamination.

To initiate the crosslinking reaction, it is customary to use initiators, i.e. free-radical formers activatable by means of heat, light, moisture or electron beams.

In a preferred embodiment of the present invention, the composition (B) therefore also comprises an initiator selected from the group consisting of peroxidic compounds, azo compounds, photoinitiators. More preferably, the initiator is selected from the group consisting of peroxidic compounds, azo compounds. Examples of these are described in the "*Encyclopedia of Chemical Technology* 1992, 3rd Edition, Vol. 17, pages 27-90".

Peroxidic compounds are especially organic peroxides, which are in turn selected from the group consisting of dialkyl peroxides, diperoxy ketals, peroxycarboxylic esters, peroxycarbonates.

Dialkyl peroxides are especially selected from the group consisting of dicumyl peroxide, di-tert-butyl peroxide, ditert-hexyl peroxide, tert-butylcumyl peroxide, iso-propylcumyl tert-butyl peroxide, tert-hexylcumyl peroxide, 2,5-dimethyl-2,5-di(tert-butylperoxy)hexane, 2,5-dimethyl-2,5-di(tert-amylperoxy)hexane, 2,5-dimethyl-2,5-di(tert-butylperoxy)-hex-3-yne, 2,5-dimethyl-2,5-di(tert-amylperoxy)-hex-3-yne, α,α-di[(tert-butylperoxy)-iso-propyl]benzene, di-tert-amyl peroxide, 1,3,5-tri-[(tert-butylperoxy)isopropyl]benzene, 1,3-dimethyl-3-(tert-butylperoxy)butanol, 1,3-dimethyl-3-(tert-amylperoxy)butanol, iso-propylcumyl hydroperoxide.

Diperoxy ketals are especially selected from the group consisting of 1,1-di(tert-butylperoxy)-3,3,5-trimethylcyclohexane, 1,1-di(tert-amylperoxy)cyclohexane, 1,1-di(tert-butylperoxy)cyclohexane, n-butyl 4,4-di(tert-amylperoxy)valerate, ethyl 3,3-di(tert-butylperoxy)butyrate, 2,2-di(tert-butylperoxy)butane, 3,6,6,9,9-pentamethyl-3-ethoxycarbonylmethyl-1,2,4,5-tetraoxacyclononane, 2,2-di(tert-amylperoxy)propane, n-butyl 4,4-bis(tert-butylperoxy)valerate.

Peroxycarboxylic esters are especially selected from the group consisting of tert-amyl peroxyacetate, tert-butyl peroxy-3,5,5-trimethylhexanoate, tert-amyl peroxybenzoate, tert-butyl peroxyacetate, tert-butyl peroxybenzoate, OO-tert-butyl monoperoxysuccinate, OO-tert-amyl monoperoxysuccinate.

Peroxycarbonates are especially selected from the group consisting of tert-butyl peroxy-2-ethylhexylcarbonate, tert-butyl peroxy-iso-propylcarbonate, tert-amyl peroxy-2-ethylhexylcarbonate, tert-amyl peroxybenzoate. A preferred peroxycarbonate is tert-butyl peroxy-2-ethylhexylcarbonate ("TBPEHC").

The azo compound is preferably selected from the group consisting of 2,2'-azobis(2-acetoxypropane), 1,1'-azodi(hexahydrobenzonitrile).

More preferably, the initiator is selected from the group consisting of 2,5-dimethyl-2,5-di(tert-butylperoxy)hexane, tert-butyl peroxy-2-ethylhexylcarbonate, tert-butyl peroxy-3,5,5-trimethylhexanoate, 1,1-di(tert-butylperoxy)-3,5,5-trimethylcyclohexane, tert-amyl peroxy-2-ethylhexylcarbonate; most preferred is the initiator tert-butyl peroxy-2-ethylhexylcarbonate ("TBPEHC").

There is no particular restriction in the mass of the peroxidic compound or of the azo compound, preferably of the peroxidic compound, which is used, based on the mass of the polyolefin copolymer. The peroxidic compound or the azo compound, preferably the peroxidic compound, is especially used in an amount of 0.05% to 10% by weight, preferably 0.1% to 5% by weight, more preferably 0.5% to 2% by weight, based in each case on the mass of all the polyolefin copolymers encompassed by the composition (B).

Photoinitiators are especially selected from the group consisting of benzophenone, benzanthrone, benzoin, benzoin alkyl ethers, 2,2-diethoxyacetophenone, 2,2-dimethoxy-2-phenylacetophenone, p-phenoxydichloroacetophenone, 2-hydroxycyclohexylphenone, 2-hydroxyisopropylphenone, 1-phenylpropanedione 2-(ethoxycarbonyl) oxime.

The photoinitiator is especially used in an amount of 0.05% to 10% by weight, preferably 0.1% to 5% by weight, more preferably 0.2% to 3% by weight, even more preferably 0.25% to 1% by weight, based in each case on the mass of all the polyolefin copolymers encompassed by the composition (B).

In a further preferred embodiment of the present invention, the composition (B) also comprises at least one further compound selected from the group consisting of crosslinkers, silane coupling agents, antioxidants, ageing stabilizers, metal oxides, metal hydroxides, white pigments, particular preference being given to using silane coupling agents as the further compound.

The term "further compound" in the context of the invention implies that this compound is not triallyl isocyanurate, triallyl cyanurate or a compound of the chemical structure (II).

Crosslinkers here are preferably selected from the group consisting of trimethylolpropane triacrylate, trimethylolpropane trimethacrylate, divinylbenzene, acrylates and methacrylates of polyhydric alcohols. Acrylates and methacrylates of polyhydric alcohols are especially selected from the group consisting of ethylene glycol di(meth)acrylate, diethylene glycol di(meth)acrylate, polyethylene glycol di(meth)acrylate, neopentyl glycol di(meth)acrylate, hexane-1,6-diol di(meth)acrylate, nonane-1,9-diol di(meth)acrylate, decane-1,10-diol di(meth)acrylate.

There is no particular restriction here in the proportion of the crosslinkers encompassed by the composition (B). The proportion of the crosslinkers in the composition (B) is especially 0.005% to 5% by weight, preferably 0.01% to 3% by weight, more preferably 0.05% to 3% by weight, even more preferably 0.1% to 1.5% by weight, based in each case on the mass of all the polyolefin copolymers encompassed by the composition (B).

Silane coupling agents usable in accordance with the invention in the composition (B) include all silanes having an unsaturated hydrocarbyl radical and a hydrolysable radical (described, for instance, in EP 2 436 701 B1, U.S. Pat. No. 5,266,627).

Unsaturated hydrocarbyl radicals are especially selected from the group consisting of vinyl, allyl, isopropenyl, butenyl, cyclohexenyl, γ-(meth)acryloyloxyallyl.

Hydrolysable radicals are especially selected from the group consisting of hydrocarbyloxy, hydrocarbonyloxy, hydrocarbylamino. Preferably, the hydrolysable radical is selected from the group consisting of methoxy, ethoxy, formyloxy, acetoxy, propionyloxy, alkylamino, arylamino.

Preferably, the silane coupling agent is selected from the group consisting of: vinyltriethoxysilane, vinyltris-(β-methoxyethoxy)silane, vinyltriacetoxysilane, γ-acryloyloxypropyltrimethoxysilane, γ-methacryloyloxypropyltrimethoxysilane, N-(β-aminoethyl)-γ-aminopropyltrimethoxysilane, N-(β-aminoethyl)-γ-aminopropylmethyldimethoxysilane, γ-aminopropyltriethoxysilane, γ-glycidoxypropyltrimethoxysilane, γ-mercaptopropyltriethoxysilane, γ-chloropropyltrimethoxysilane, β-(3,4-ethoxycyclohexypethyltrimethoxysilane, γ-mercaptopropyltrimethoxysilane. Particular preference is given to using, as a silane coupling agent, γ-methacryloyloxypropyltrimethoxysilane (abbreviated to "KBM").

There is no particular restriction here in the proportion of the silane coupling agent encompassed by the composition (B). The proportion of all the silane coupling agents encompassed by the composition (B) is especially 0.05% to 5% by weight, preferably 0.1% to 2% by weight, based in each case on the mass of all the polyolefin copolymers encompassed by the composition (B).

Antioxidants in the context of the invention are preferably selected from the group consisting of phenolic antioxidants, phosphorus antioxidants.

Phenolic antioxidants are especially selected from the group consisting of 4-methoxyphenol, 2,6-di-tert-butyl-4-methylphenol, tert-butylhydroquinone, stearyl β-(3,5-di-tert-butyl-4-hydroxyphenyl)propionate, pentaerythrityl tetrakis[3-(3,5-di-tert-butyl-4-hydroxyphenyl)propionate], hexadecyl 3,5-di-tert-butyl-4-hydroxybenzoate.

Phosphorus antioxidants are especially selected from the group consisting of triphenyl phosphite, tris(nonylphenyl) phosphite, distearylpentaerythritol diphosphite, tetra(tridecyl)-1,1,3-tris-(2-methyl-5-tert-butyl-4-hydroxyphenyl)butane diphosphate, tetrakis(2,4-di-tert-butylphenyl)-4,4-biphenyl diphosphonite.

There is no particular restriction here in the proportion of the antioxidants encompassed by the composition (B). The proportion of all the antioxidants encompassed by the composition (B) is especially 0.01% to 0.5% by weight, preferably 0.05% to 0.3% by weight, based in each case on the mass of all the polyolefin copolymers encompassed by the composition (B).

Ageing stabilizers in the context of the invention are especially selected from the group of the "hindered amine light stabilizers" (="HALS") stabilizers and the UV absorbers.

HALS stabilizers in the context of the invention are especially compounds having at least one 2,2,6,6-tetramethyl-4-piperidyl radical, where the nitrogen atom at the 1 position of the piperidyl radical bears an H, an alkyl group or an alkoxy group.

Preference is given to HALS stabilizers selected from the group consisting of bis(2,2,6,6-tetramethyl-4-piperidyl)sebacate, 1,2,2,6,6-pentamethyl-4-piperidyl sebacate, bis(1,2,2,6,6-pentamethyl-4-piperidyl)sebacate, bis-(1-octyloxy-2,2,6,6-tetramethyl-4-piperidyl)sebacate, poly {(6-morpholino-S-triazine-2,4-diyl) [2,2,6,6-tetramethyl-4-piperidyl)imino]hexamethylene[(2,2,6,6-tetramethyl-4-piperidyl)imino]} having CAS Number 82451-48-7, polymers of CAS Number 193098-40-7, copolymer of dimethyl succinate and 1-(2-hydroxyethyl)-2,2,6,6-tetramethyl-4-piperidinol, N,N',N'',N'''-tetrakis-{4,6-bis[butyl(N-methyl-2,2,6,6-tetramethylpiperidin-4-yl)amino]triazin-2-yl}-4,7-diazadecane-1,10-diamine having CAS Number 106990-43-6.

There is no particular restriction here in the proportion of the HALS stabilizers encompassed by the composition (B). The proportion of all the HALS stabilizers encompassed by the composition (B) is especially 0.01% to 0.5% by weight, preferably 0.05% to 0.3% by weight, based in each case on the mass of all the polyolefin copolymers encompassed by the composition (B).

UV absorbers are especially selected from the group consisting of 2-hydroxy-4-N-octoxybenzophenone, 2,4-di-tert-butylphenyl 3,5-di-tert-butyl-4-hydroxybenzoate, 2-hydroxy-4-methoxybenzophenone, 2,2-dihydroxy-4-methoxybenzophenone, 2-hydroxy-4-methoxy-4-carboxybenzophenone, 2-(2-hydroxy-3,5-di-tert-butylphenyl)benzotriazole, 2-(2-hydroxy-5-methylphenyl)benzotriazole, p-octylphenyl salicylate, 2-(4,6-diphenyl-1,3,5-triazin-2-yl)-5-[(hexyl)oxy]phenol, ethyl 2-cyano-3,3-diphenylacrylate.

There is no particular restriction here in the proportion of the UV absorbers encompassed by the composition (B). The proportion of all the UV absorbers encompassed by the composition (B) is especially 0.01% to 0.5% by weight, preferably 0.05% to 0.3% by weight, based in each case on the mass of all the polyolefin copolymers encompassed by the composition (B).

According to the invention, metal oxides are especially selected from the group consisting of alkali metal oxides, alkaline earth metal oxides, zinc oxide, preferably selected from the group consisting of magnesium oxide, zinc oxide.

There is no particular restriction here in the proportion of the metal oxides encompassed by the composition (B). The proportion of all the metal oxides encompassed by the composition (B) is especially 0.01% to 10% by weight, preferably 0.05% to 3% by weight, based in each case on the mass of all the polyolefin copolymers encompassed by the composition (B).

According to the invention, metal hydroxides are especially selected from the group consisting of alkali metal hydroxides, alkaline earth metal hydroxides, preferably selected from the group consisting of magnesium hydroxide, calcium hydroxide.

There is no particular restriction here in the proportion of the metal hydroxides encompassed by the composition (B). The proportion of all the metal hydroxides encompassed by the composition (B) is especially 0.01% to 10% by weight, preferably 0.05% to 3% by weight, based in each case on the mass of all the polyolefin copolymers encompassed by the composition (B).

White pigments in the context of the invention are especially selected from the group of titanium dioxide, zinc oxide, zinc sulphide, barium sulphate, lithopone.

There is no particular restriction here in the proportion of the white pigments encompassed by the composition (B). The proportion of all the white pigments encompassed by the composition (B) is especially 5% to 25% by weight, preferably 10% to 20% by weight, even more preferably 15% by weight, based in each case on the mass of all the polyolefin copolymers encompassed by the composition (B).

The polymer composition (B), in a further aspect of the present invention, is used to produce a film for encapsulation of an electronic device, especially a solar cell.

In this case, the composition (B) is first produced by mixing the composition (A) and the particular additives and the polyolefin copolymer. This is especially effected by adding the additives in liquid form, i.e. in pure form or as a solution in a solvent, to the composition (B) in a mixer. This is followed by stirring or keeping the mixture in motion until the liquid has been completely absorbed by the polymer pellets. Any solvents used are then removed again by applying a vacuum.

In a second step, the polymer formulation is extruded by means of an extruder to give a film. In this case, the composition (B) is metered continuously through a metering screw into an extruder in which the polymer is melted and the additives are distributed homogeneously in the polymer matrix by the kneading of the mixture. At the end of the extruder, the melt is passed through a slot die. Downstream of the nozzle, the film is drawn off by means of a roll mill, cooled and rolled up.

Alternatively, the additives or the adhesive mixture can also be metered directly into the film extruder via the filling stub or via a side feed.

The examples which follow are intended to further illustrate the present invention, without any intention that it be restricted to these examples.

Having generally described this invention, a further understanding can be obtained by reference to certain specific examples which are provided herein for purposes of illustration only, and are not intended to be limiting unless otherwise specified.

EXAMPLES

Abbreviations Used

γ-methacryloyloxypropyltrimethoxysilane=KBM.
tert-butyl peroxy-2-ethylhexylcarbonate=TBPEHC.

triallyl isocyanurate=TAIC.
triallyl cyanurate=TAC.

Chemicals Used

The triallyl isocyanurate used hereinafter was "TAICROS®" from Evonik Industries AG.

The triallyl cyanurate used hereinafter was "TAC" from Evonik Industries AG.

The γ-methacryloyloxypropyltrimethoxysilane used hereinafter was "Dynasylan Memo®" from Evonik Industries AG.

The EVA used hereinafter was "EVATANE 28-40" ® from Arkema having a vinyl acetate content of 28.3% by weight.

The tert-butyl peroxy-2-ethylhexylcarbonate (=TBPEHC") used hereinafter was acquired from United Initiators.

Diallyl n-propyl isocyanurate (CAS: 5320-25-2) was sourced from ABCR GmbH.

Diethyl iminodiacetate (CAS: 6290-05-7) was sourced from ABCR GmbH.

Allylamine (CAS: 107-11-9) was sourced from ABCR GmbH.

1. Syntheses 1.1 Triallyl Biuret

Triallyl biuret was obtained by ring opening of triallyl isocyanurate in an aqueous alkaline medium as follows:

A 3 l jacketed reactor with a paddle stirrer was initially charged with 830 g (20.8 mol) of a 40% NaOH solution and 1330 g (73.8 mol) of water and heated to 95° C. After adding 800 g (3.2 mol) of triallyl isocyanurate, the colloidal solution was stirred vigorously at 95° C. for 4 hours. The organic phase was washed repeatedly with distilled water and then dried under reduced pressure. The yield was 677.2 g (3.03 mol) of triallyl biuret with a purity of 97.4% (determined by gas chromatography).

1.2 n-Propyl Diallyl Biuret n-Propyl diallyl biuret was obtained by ring opening of diallyl n-propyl isocyanurate in an aqueous alkaline medium as follows:

1.0 g (4.0 mmol) of diallyl n-propyl isocyanurate was stirred vigorously in 1.5 g of water and 1.0 g of 40% NaOH at 95° C. for 15 hours. The product was obtained in 96% yield. Purification was effected by repeatedly washing with distilled water.

1.3 Iminodi(N-allylacetamide)

2 g (10.6 mmol) of diethyl iminodiacetate (CAS: 6290-05-7) and 3 g (52 mmol) of allylamine (CAS: 107-11-9) were initially charged in a pressure reactor and then heated at 90-100° C. for 2-3 hours. Subsequently, ethanol released and excess allylamine were removed by fractional distillation and the allylamine removed was subsequently fed back to the reaction solution. The reaction mixture was heated once again for 2-3 hours and the procedure was repeated 3 times until conversion was complete (full conversion determined by HPLC). Residues of ethanol and allylamine were removed under reduced pressure.

2. Preparation of the Example Formulations 2.1 Comparative Example C1

2.5 g (10.0 mmol) of triallyl isocyanurate were mixed homogeneously with 0.5 g of KBM and 4.0 g of TBPEHC. The mixture was distributed homogeneously over 493 g of EVA and the additive mixture thus obtained was then mixed in a tumbling mixer for 2 to 4 hours.

Example 1

2.48 g (9.95 mmol) of TAIC were mixed homogeneously together with 0.05 g (0.23 mmol) of triallyl biuret (molar mass: 223.27 g/mol), 0.5 g of KBM and 4.0 g of TBPEHC. The mixture was distributed homogeneously over 493 g of EVA and the additive mixture thus obtained was then mixed in a tumbling mixer for 2 to 4 hours.

Example 2

2.42 g (9.73 mmol) of TAIC were mixed homogeneously together with 0.076 g (0.34 mmol) of triallyl biuret, 0.5 g of KBM and 4.0 g of TBPEHC. The mixture was distributed homogeneously over 493 g of EVA and the additive mixture thus obtained was then mixed in a tumbling mixer for 2 to 4 hours.

Example 3

2.38 g (9.53 mmol) of TAIC were mixed homogeneously together with 0.125 g (0.56 mmol) of triallyl biuret, 0.5 g of KBM and 4.0 g of TBPEHC. The mixture was distributed homogeneously over 493 g of EVA and the additive mixture thus obtained was then mixed in a tumbling mixer for 2 to 4 hours.

Example 4

2.35 g (9.43 mmol) of TAIC were mixed homogeneously together with 0.150 g (0.67 mmol) of triallyl biuret, 0.5 g of KBM and 4.0 g of TBPEHC. The mixture was distributed homogeneously over 493 g of EVA and the additive mixture thus obtained was then mixed in a tumbling mixer for 2 to 4 hours.

Example 5

2.25 g (9.03 mmol) of TAIC were mixed homogeneously together with 0.250 g (1.12 mmol) of triallyl biuret, 0.5 g of KBM and 4.0 g of TBPEHC. The mixture was distributed homogeneously over 493 g of EVA and the additive mixture thus obtained was then mixed in a tumbling mixer for 2 to 4 hours.

Example 6

2.00 g (8.02 mmol) of TAIC were mixed homogeneously together with 0.500 g (2.24 mmol) of triallyl biuret, 0.5 g of KBM and 4.0 g of TBPEHC. The mixture was distributed homogeneously over 493 g of EVA and the additive mixture thus obtained was then mixed in a tumbling mixer for 2 to 4 hours.

Example 7

2.45 g (9.83 mmol) of TAIC were mixed homogeneously together with 0.04 g (0.19 mmol) of n-propyl diallyl biuret (molar mass: 225.27 g/mol), 0.5 g of KBM and 4.0 g of TBPEHC. The mixture was distributed homogeneously over 493 g of EVA and the additive mixture thus obtained was then mixed in a tumbling mixer for 2 to 4 hours.

Example 8

2.47 g (9.93 mmol) of TAIC were mixed homogeneously together with 0.025 g (0.12 mmol) of iminodi(N-allylacetamide) (molar mass: 211.25 g/mol), 0.5 g of KBM and 4.0 g of TBPEHC. The mixture was distributed homogeneously over 493 g of EVA and the additive mixture thus obtained was then mixed in a tumbling mixer for 2 to 4 hours.

Example 9

2.45 g (9.83 mmol) of TAIC were mixed homogeneously together with 0.052 g (0.25 mmol) of iminodi(N-allylacetamide), 0.5 g of KBM and 4.0 g of TBPEHC. The mixture was distributed homogeneously over 493 g of EVA and the additive mixture thus obtained was then mixed in a tumbling mixer for 2 to 4 hours.

Example 10

2.40 g (9.63 mmol) of TAIC were mixed homogeneously together with 0.106 g (0.50 mmol) of iminodi(N-allylacetamide), 0.5 g of KBM and 4.0 g of TBPEHC. The mixture was distributed homogeneously over 493 g of EVA and the additive mixture thus obtained was then mixed in a tumbling mixer for 2 to 4 hours.

Comparative Example C2

2.5 g (10 mmol) of triallyl cyanurate (="TAC") were mixed homogeneously with 0.5 g of KBM and 4.0 g of TBPEHC. The mixture was distributed homogeneously over 493 g of EVA and the additive mixture thus obtained was then mixed in a tumbling mixer for 2 to 4 hours.

Example 11

2.43 g (9.73 mmol) of TAC were mixed homogeneously together with 0.075 g (0.34 mmol) of triallyl biuret, 0.5 g of KBM and 4.0 g of TBPEHC. The mixture was distributed homogeneously over 493 g of EVA and the additive mixture thus obtained was then mixed in a tumbling mixer for 2 to 4 hours.

Example 12

2.38 g (9.53 mmol) of TAC were mixed homogeneously together with 0.125 g (0.56 mmol) of triallyl biuret, 0.5 g of KBM and 4.0 g of TBPEHC. The mixture was distributed homogeneously over 493 g of EVA and the additive mixture thus obtained was then mixed in a tumbling mixer for 2 to 4 hours.

Example 13

2.25 g (9.03 mmol) of TAC were mixed homogeneously together with 0.25 g (1.11 mmol) of triallyl biuret, 0.5 g of KBM and 4.0 g of TBPEHC. The mixture was distributed homogeneously over 493 g of EVA and the additive mixture thus obtained was then mixed in a tumbling mixer for 2 to 4 hours.

3. Film Extrusion

For production of the EVA films, the conditioned EVA pellets which had been prepared as described in Examples C1, C2 and 1-13 were metered volumetrically into a twin-screw laboratory extruder (Collin). The EVA melt was extruded through a slot die (10 cm) having adjustable gap width, the film was cooled continuously in a roller system to 20° C. and then rolled up. The extruder settings are listed below:

| Extrusion parameters for EVA film production Heating zone temperatures [° C.] | |
|---|---|
| T1 | 70 |
| T2 | 77 |
| T3 | 77 |
| T4 | 75 |
| T5 | 80 |
| Die | 80 |
| T(melt) | 87-90 |

4. Film Lamination

The lamination of the EVA film was conducted at 150° C. (machine setting) between Teflon release films, and the same temperature was kept constant over the entire lamination process. The duration of the one-stage devolatilization step was 100 s. Subsequently, the sample was subjected to a contact pressure of 0.7 kg/cm$^2$. The residence time in the laminator was 20 minutes.

5. Determination of Specific Resistance p

For the determination of the resistivity of crosslinked EVA films of thickness 400 to 500 μm, samples having dimensions of about 8×8 cm were first stored at room temperature (22.5° C.) and a relative air humidity of 50% for 7 days in order to assure a constant moisture level within the EVA film.

The resistivity measurement was conducted with a Keithley ohmmeter (6517B) and a corresponding test cell, likewise from Keithley ("resistivity test fixture 8009"). In accordance with ASTM D-257, the sample was subjected to a voltage of 500 V for 60 s and the current was measured after this time. The resistivity (VR) can then be calculated from the known parameters.

6. Results of the Resistivity Measurements on the Example Formulations

6.1 Comparative Example C1, Inventive Examples 1 to 10

Table 1 below states the VR values which were measured with the films produced with the EVA pellets obtained according to Comparative Example C1 and the EVA pellets obtained according to Inventive Examples 1 to 10. The co-crosslinker system here comprised TAIC and the cross-linking additive specified in Table 1 in each case in the amounts likewise specified in Table 1.

TABLE 1

| Example No. | TAIC in mmol; weight in "[ ]" | Crosslinking additives Type | Additive in mmol; weight in "[ ]" | Proportion of additive based on TAIC in mol % | Proportion of additive based on TAIC in % by wt. | VR * $10^{15}$ [ohm*cm] |
|---|---|---|---|---|---|---|
| C1 | 10.0 [2.50 g] | | 0 | 0 | | 3.77 |
| 1 | 9.95 [2.48 g] | triallyl biuret | 0.23 [0.05 g] | 2.3 | 2.1 | 5.15 |
| 2 | 9.73 [2.42 g] | triallyl biuret | 0.34 [0.076 g] | 3.5 | 3.1 | 32.22 |
| 3 | 9.53 [2.38 g] | triallyl biuret | 0.56 [0.125 g] | 5.9 | 5.3 | 16.73 |
| 4 | 9.43 [2.35 g] | triallyl biuret | 0.67 [0.150 g] | 7.1 | 6.4 | 12.39 |
| 5 | 9.03 [2.25 g] | triallyl biuret | 1.12 [0.250 g] | 12.4 | 11.1 | 10.45 |
| 6 | 8.02 [2.00 g] | triallyl biuret | 2.24 [0.500 g] | 27.9 | 25.0 | 14.14 |
| 7 | 9.83 [2.45 g] | n-propyl diallyl biuret | 0.19 [0.04 g] | 1.9 | 1.7 | 5.92 |
| 8 | 9.93 [2.47 g] | iminodi(N-allylacetamide) | 0.12 [0.025 g] | 1.2 | 1.0 | 5.90 |
| 9 | 9.83 [2.45 g] | iminodi(N-allylacetamide) | 0.25 [0.052 g] | 2.5 | 2.2 | 8.12 |
| 10 | 9.63 [2.40 g] | iminodi(N-allylacetamide) | 0.50 [0.106 g] | 5.2 | 4.4 | 10.57 |

6.2 Comparative Example C2, Inventive Examples 11 to 13

Table 2 below states the VR values which were measured with the films produced with the EVA pellets obtained according to Comparative Example C2 and the EVA pellets obtained according to Inventive Examples 11 to 13. The respective co-crosslinker system here comprised TAC and triallyl biuret in the amounts specified in Table 2.

TABLE 2

| Example No. | TAC in mmol; weight in "[ ]" | Triallyl biuret in mmol; weight in "[ ]" | Proportion of triallyl biuret based on TAC in mol % | Proportion of triallyl biuret based on TAC in % by wt. | VR * $10^{15}$ [ohm*cm] |
|---|---|---|---|---|---|
| C2 | 10.0 [2.5 g] | — | — | — | 4.2 |
| 11 | 9.73 [2.43 g] | 0.34 [0.075 g] | 3.5 | 3.1 | 16.94 |
| 12 | 9.53 [2.38 g] | 0.56 [0.125 g] | 5.9 | 5.3 | 17.91 |
| 13 | 9.03 [2.25 g] | 1.11 [0.25 g] | 12.3 | 11.1 | 10.65 |

The results shown in Tables 1 and 2 demonstrate that it is possible with the co-crosslinker system according to the invention, i.e. composition (A), to obtain films having high specific resistance. Thus, all the VR values of the films produced with the co-crosslinker system according to the invention are higher than the value for the film which was obtained with a related art crosslinker, TAIC or TAC.

European patent application EP14199279 filed Dec. 19, 2014, is incorporated herein by reference.

Numerous modifications and variations on the present invention are possible in light of the above teachings. It is therefore to be understood that within the scope of the appended claims, the invention may be practiced otherwise than as specifically described herein.

The invention claimed is:

1. A composition (A), comprising:
   (i) at least one compound (I) selected from the group consisting of triallyl isocyanurate, and triallyl cyanurate; and
   (ii) at least one compound (II) defined by the structural formula:

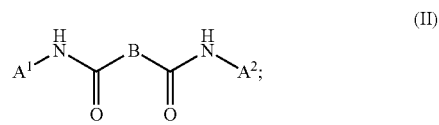

(II)

wherein $A^1$, $A^2$ are each independently selected from the group consisting of the following a) and b)

(a) an unbranched or branched alkenyl group which has 3 to 18 carbon atoms and at least one terminal double bond, and (b) a group of the chemical structure (III) with

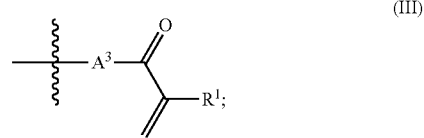

(III)

wherein $R^1$ = hydrogen or methyl;

$A^3$ is an unbranched or branched alkylene group having 1 to 12 carbon atoms; and B is selected from the group consisting of —NR²—, —(CH₂)ₚ—NR³—(CH₂)_q— and the chemical structure (IV) with

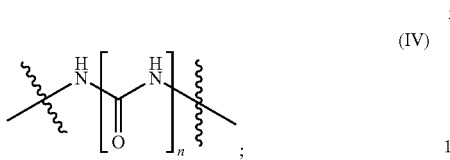
(IV)

wherein R² and R³ are each independently selected from the group consisting of i) hydrogen, ii) an alkyl group having 1 to 20 carbon atoms, iii) an unbranched or branched alkenyl group which has 3 to 18 carbon atoms and at least one terminal double bond, and iv) a group of the chemical structure (V) with

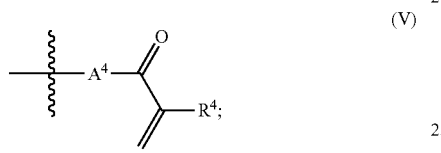
(V)

wherein
R⁴=hydrogen or methyl;
A⁴ is an unbranched or branched alkylene group having 1 to 12 carbon atoms; and
wherein n, p, q are each independently an integer in the range of 1 to 5; and
wherein at least one compound (II) is present in a proportion of at least 1% by weight based on a total weight of all the compounds (I) in the composition (A).

2. The composition (A) according to claim 1, wherein the compound (I) is triallyl isocyanurate.

3. The composition (A) according to claim 1, wherein A¹, A² are each independently selected from the group consisting of an allyl group, a methallyl group, and a group of the chemical structure (III) with

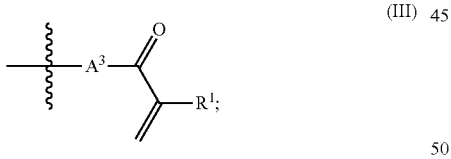
(III)

wherein
R¹=hydrogen or methyl;
A³ is an unbranched or branched alkylene group having 1 to 6 carbon atoms;
B is selected from the group consisting of —NR²—, —CH₂—NH—CH₂—, and the chemical structure (IV) with

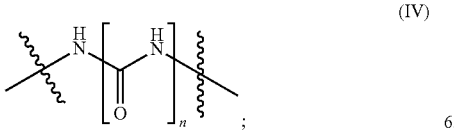
(IV)

wherein R² is selected from the group consisting of hydrogen, an alkyl group having 1 to 20 carbon atoms, allyl group, a methallyl group, and a group of the chemical structure (V) with

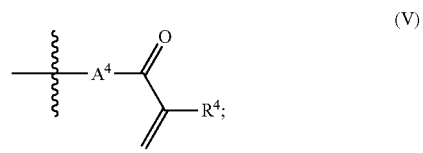
(V)

wherein
R⁴=hydrogen or methyl;
A⁴ is an unbranched or branched alkylene group having 1 to 6 carbon atoms; and
wherein n is an integer in the range of 1 to 3.

4. The composition (A) according to claim 3, wherein the compound (II) is selected from the group consisting of the chemical structures (VI), (VII), (VIII), (IX), and (X) with

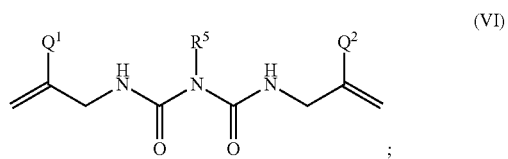
(VI)

(VII)

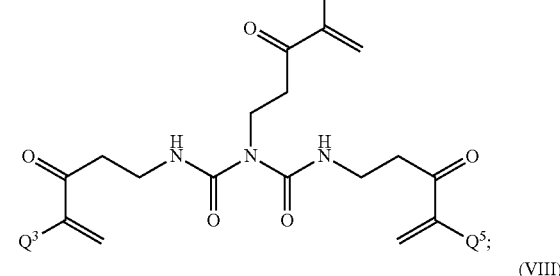
(VIII)

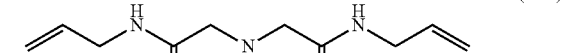
(IX)

(X)

wherein R⁵ is selected from the group consisting of hydrogen, an alkyl group having 1 to 20 carbon atoms, an allyl group, and a methallyl group; and
wherein Q¹, Q², Q³, Q⁴, Q⁵ are each independently hydrogen or methyl.

5. The composition (A) according to claim 1, wherein a total weight of all the compounds (II) in the composition (A) is 1% to 50% by weight, based on the total weight of all the compounds (I) in the composition (A).

6. A composition (B), comprising:
at least one polyolefin copolymer; and
the composition (A) according to claim 1.

7. The composition (B) according to claim 6, wherein the polyolefin copolymer is an ethylene-vinyl acetate copolymer.

8. The composition (B) according to claim 7, wherein the ethylene-vinyl acetate copolymer has a vinyl acetate content of 15% to 50% by weight, based on a total weight of the ethylene-vinyl acetate copolymer, determined according to ASTM D 5594:1998.

9. The composition (B) according to claim 6, in which the proportion of composition (A) is 0.05% to 10% by weight, based on a mass of all the polyolefin copolymers in the composition (B).

10. The composition (B) according to claim 6, further comprising at least one initiator selected from the group consisting of peroxidic compounds, azo compounds, and photoinitiators.

11. The composition (B) according to claim 10, wherein the initiator is a peroxidic compound.

12. The composition (B) according to claim 6, further comprising at least one compound (D) selected from the group consisting of crosslinkers, silane coupling agents, antioxidants, ageing stabilizers, metal oxides, metal hydroxides, and white pigments.

13. The composition (B) according to claim 12, wherein the compound (D) is a silane coupling agent.

14. A film for encapsulation of an electronic device, comprising: the composition (B) according to claim 6 in crosslinked form.

15. The film according to claim 14, wherein the device is a solar cell.

16. A method for encapsulating an electronic device, comprising:
contacting said electronic device with the composition (B) of claim 6 and crosslinking said composition (B).

17. The method according to claim 16, wherein the device is a solar cell.

18. The method according to claim 17, wherein the crosslinking of the composition (B) occurs in the course of solar module lamination.

* * * * *